(12) United States Patent
Park et al.

(10) Patent No.: US 6,964,930 B2
(45) Date of Patent: Nov. 15, 2005

(54) METHOD OF FABRICATING DIELECTRIC LAYER

(75) Inventors: Dong Su Park, Kyoungki-do (KR); Tae Hyeok Lee, Kyoungki-do (KR); Chang Rock Song, Kyoungki-do (KR); Cheol Hwan Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 27 days.

(21) Appl. No.: 10/739,620

(22) Filed: Dec. 18, 2003

(65) Prior Publication Data

US 2004/0219802 A1 Nov. 4, 2004

(30) Foreign Application Priority Data

Apr. 30, 2003 (KR) .................... 10-2003-0027511

(51) Int. Cl.[7] .................. H01L 21/302; H01L 21/461
(52) U.S. Cl. ........................... 438/745; 438/954
(58) Field of Search ................... 438/745, 706, 438/680, 769, 770, 773, 775, 954

(56) References Cited

U.S. PATENT DOCUMENTS

| | | | |
|---|---|---|---|
| 5,812,403 A * | 9/1998 | Fong et al. ............ | 364/468.28 |
| 5,926,711 A * | 7/1999 | Woo et al. ............... | 438/260 |
| 5,981,404 A * | 11/1999 | Sheng et al. ............. | 438/791 |
| 6,147,013 A | 11/2000 | Sun et al. ................ | 438/791 |
| 6,180,538 B1 * | 1/2001 | Halliyal et al. .......... | 438/769 |
| 6,344,394 B1 | 2/2002 | Kaneoka .................. | 438/261 |
| 6,358,864 B1 | 3/2002 | Chang et al. ............. | 438/763 |
| 6,586,349 B1 | 7/2003 | Jeon et al. ............... | 438/785 |
| 6,852,136 B2 * | 2/2005 | Park et al. ............... | 29/25.03 |

* cited by examiner

*Primary Examiner*—David Nhu
(74) *Attorney, Agent, or Firm*—Ladas & Parry LLP

(57) ABSTRACT

In fabricating a dielectric layer, a semiconductor substrate which has been washed is provided. A first nitride film is formed by loading the substrate in a first furnace and subjecting the substrate to a first nitride treatment. A first oxide film is formed by unloading the substrate having the first nitride film out of the first furnace and subjecting the substrate to a first nitride treatment by introducing air while the substrate is unloaded. A second nitride film is formed by loading the substrate having the first oxide film in a second furnace and subjecting the substrate to a second nitride treatment. A second oxide film is formed by subjecting the top surface of the second nitride film to a second oxide treatment.

17 Claims, 3 Drawing Sheets

METHOD OF FABRICATING DIELECTRIC LAYER

BACKGROUND OF THE INVENTION

1. Field of the Invention

The present invention relates to a method of fabricating a semiconductor device, and more particularly to a method of fabricating a dielectric layer having a high dielectric property.

2. Description of the Prior Art

As generally known in the art, a dielectric layer is realized mainly by a $SiO_2$ oxide film formed by oxidizing a silicon substrate, but such a $SiO_2$ oxide film has a limitation in securing capacitance of a gate electrode.

Therefore, in order to solve this problem, techniques for using a nitride film or a $Ta_2O_5$ film, which has a high dielectric property, as a dielectric layer have been developed. However, when a single nitride film structure (an NO structure or an ONO structure) is employed as a dielectric layer, leakage current is caused because of pin holes, micro clacks, and so forth, which the nitride film itself has. Also, when the $Ta_2O_5$ film is employed as a dielectric layer, since the stoichiometric ratio of the $Ta_2O_5$ film itself is unstable, a breakdown strength characteristic is bad. Therefore, in this case, in order to secure a sufficiently high breakdown strength, low-temperature heat treatment at the temperature of 400° C. must be performed several times with high-temperature heat treatment at the temperature of 700~900° C., so that the number of processes and an investment amount for equipment increase.

SUMMARY OF THE INVENTION

Accordingly, the present invention has been made to solve the above-mentioned problems occurring in the prior art, and an object of the present invention is to provide a method of fabricating a dielectric layer which has an improved breakdown strength characteristic and can be fabricated by a simplified process.

In order to accomplish this object, there is provided a method of fabricating a dielectric layer, the method comprising the steps of: providing a semiconductor substrate which has been washed; forming a first nitride film by loading the substrate in a first furnace and subjecting the substrate to a first nitride treatment; forming a first oxide film by unloading the substrate having the first nitride film out of the first furnace and subjecting the substrate to a first nitride treatment by means of air introduced while the substrate is unloaded; forming a second nitride film by loading the substrate having the first oxide film in a second furnace and subjecting the substrate to a second nitride treatment; and forming a second oxide film by subjecting the top surface of the second nitride film to a second oxide treatment.

The washing treatment process is performed by means of one wet-etching solution of HF and BOE or by means of a mixed liquid of $NH_4OH$, $H_2O_2$, and deionized water (DIW) or a $H_2SO_4$ solution as a wet-etching solution so as to form an initial oxide film on the surface of the substrate.

In the first nitride treatment process, a heat treatment is performed for 3~180 minutes under a condition in which a temperature and a pressure in the first furnace is set to 600~900° C. and 0.05~760 Torr, and $NH_3$ gas is supplied.

In the unloading process, a temperature of the last stage before unloading the substrate out of the first furnace is maintained at 300~600° C., and air including oxygen is supplied into the first furnace.

The second nitride treatment process is performed by means of a chemical vapor deposition method using a mixed gas form among $SiH_4+NH_3$ and $SiH_2Cl_2+NH_3$ at a temperature of 600~800° C. and under a pressure of 0.05~2 Torr.

The second oxide film formation process is performed by one method selected from the group consisting of a wet oxidization method, a dry oxidization method, and an $O_3$ oxidization method, in a third furnace, not in the first and the second furnace.

In accordance with another aspect of the present invention, there is provided a method of fabricating a dielectric layer, providing a semiconductor substrate which has been washed; forming a first nitride film by subjecting the substrate to a first nitride treatment; forming a first oxide film by subjecting the substrate having the first nitride film to a first nitride treatment; forming a second nitride film by subjecting the substrate having the first oxide film to a second nitride treatment; and forming a second oxide film by subjecting the top surface of the second nitride film to a second oxide treatment.

The washing treatment process is performed by means of one wet-etching solution of HF and BOE or by means of a mixed liquid of $NH_4OH$, $H_2O_2$, and deionized water (DIW) or a $H_2SO_4$ solution as a wet-etching solution so as to form an initial oxide film on the surface of the substrate.

Each of the first and second nitride treatment processes is performed by means of a chemical vapor deposition method using a mixed gas from among $SiH_4+NH_3$ and $SiH_2Cl_2+NH_3$ at a temperature of 600~800° C. and under a pressure of 0.05~2 Torr.

In the first oxide treatment process, one of an oxygen gas and a mixture of an oxygen gas and an inert gas is supplied at a temperature of 600~800° C. and under a pressure of 0.05~100 Torr.

The total thickness of the first nitride film, the first oxide film, and the second nitride film is 30~60 Å.

The processes of forming the first nitride film, the first oxide film, and the second nitride film are performed in a first furnace, and the process of forming the second oxide film is performed in a second furnace, not in the first furnace. Also, the processes of forming the first nitride film, the first oxide film, the second nitride film, and the second oxide film may be performed in the same furnace.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
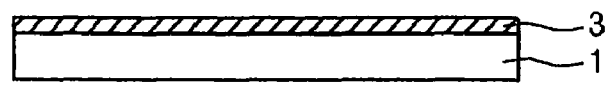
FIGS. 1a to 1d are cross-sectional views, which are illustrated by the process, for explaining a method of fabricating a dielectric layer having an ONONO structure according to a first embodiment of the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

First, a semiconductor substrate having been subjected to a semiconductor fabrication process is washed, thereby removing an oxide film and impurities remaining on the surface of the substrate after the semiconductor fabrication process. Thereafter, a dielectric layer according to the present invention is formed on the substrate which has been washed. In this case, the washing process can is performed using cleaning solutions such as HF, BOE, etc.; a mixed liquid of $NH_4$, $H_2O_2$ deionized water (DIW); or a $H_2SO_4$ solution, according to necessity.

In the case of using HF or BOE as a wet cleaning solution, an oxide film is removed and doesn't remain on the surface of the substrate after the substrate has been washed. However, in the case of using the mixed liquid of $NH_4OH$, $H_2O_2$, and deionized water (DIW) or using $H_2SO_4$, an oxide film with a thickness of 10 Å is formed on the surface of the substrate due to chemicals after the substrate has been washed. Therefore, according to the kind of a used cleaning solution, a dielectric layer formed on the substrate having been washed has one structure from among an NONO structure and an ONONO structure.

Hereinafter, an embodiment of the present invention, which employs a dielectric layer having the ONONO structure, and another embodiment of the present invention, which employs a dielectric layer having the NONO structure, will be described.

FIGS. 1a to 1d are cross-sectional views, which are illustrated by the process, for explaining a method of fabricating a dielectric layer having an ONONO structure according to a first embodiment of the present invention.

The method of fabricating a dielectric layer having the ONONO structure according to the first embodiment, as shown in FIG. 1a, including a washing process which is performed on a semiconductor substrate having undergone a semiconductor fabricating process by means of a wet cleaning solution of a mixed liquid of $NH_4OH$, $H_2O_2$, and deionized water (DIW) or a $H_2SO_4$ solution. As a result, a first oxide film 3 is formed on the surface of a substrate 1.

Figure 1B:
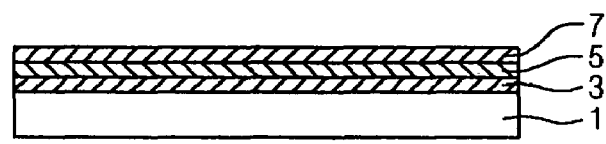

Next, as shown in FIG. 1b, the substrate having the first oxide film 3 is loaded in a first furnace (not shown) and then $NH_3$ gas is supplied into the first furnace. Therefore, the substrate is subjected to a first nitride treatment, and thereby a first nitride film (SiN or SiON) 5 is formed on the first oxide film 3. At this time, the first nitride treatment process is performed by means of a heat treatment for 3~180 minutes while the inside of the first furnace is maintained at a temperature of 600° C. to 900° C. and under a pressure of 0.05 Torr to 760 Torr.

Subsequently, the substrate having the first nitride film 5 is subjected to a first oxide treatment, so that a second oxide film 7 is formed on the first nitride film 5. In this case, the total thickness of the first oxide film, the first nitride film, and the second oxide film is 15 Å.

The first oxide treatment process is performed in the first furnace in which the first nitride treatment process has been performed. Here, an apparatus without a separate unit for minimizing oxygen concentration, for example, a nitrogen purge box, is used as a first furnace.

The first oxide treatment process is performed during a process of unloading the substrate on which the first nitride film 5 has been formed in the first furnace, and oxygen is supplied into the first furnace when the substrate is unloaded.

The oxygen flows in the first furnace together with air and then is combined only on the surface of the first nitride film 5, and thereby a second oxide film 7 is formed. Then, at the last stage of a process unloading the substrate, the first furnace is set to a temperature of 300° C. to 600° C.

In a first embodiment of the present invention, the first oxide treatment process is performed in such a manner that air including oxygen flows in the first furnace, and so that the second oxide film 7 is formed only on the surface of the first nitride film 5 of the substrate. Herein, if the process of forming the second oxide film 7 is performed by means of a directly oxidation method, such as a dry and a wet oxidation method, etc., the interface of the substrate as well as the surface of the first nitride film 5 may be oxidized. Therefore, an oxide treatment process by means of air is used for forming the second oxide film 7.

Figure 1C:
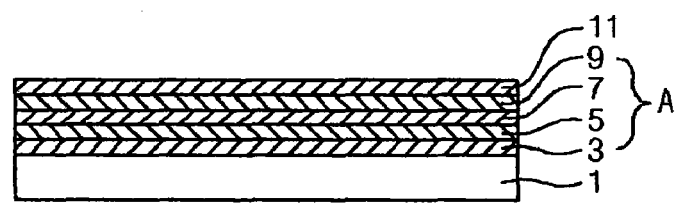
Figure 1D:
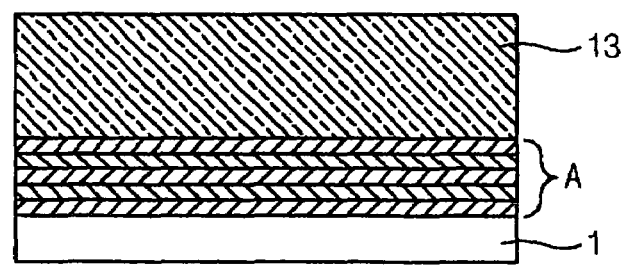

Thereafter, as shown in FIG. 1c, the substrate having the second oxide film 7 is again loaded in a second furnace (not shown) and is subjected to a second nitride treatment, and thereby a second nitride film 9 is formed. In this case, the second nitride treatment process is performed by means of a chemical vapor deposition method in such a manner that the second furnace is set to a temperature of 600~800° C. and a pressure of 0.05~2 Torr and a mixed gas from among $SiH_4+NH_3$ and $SiH_2Cl_2+NH_3$ is supplied in the second furnace.

Next, the substrate on which the second nitride film 9 has been formed is loaded in a third furnace (not shown), and then the top surface of the second nitride film 9 is subjected to a third oxide treatment, and thereby a third oxide film 11 is formed.

The third oxide film 11 is a film for preventing phenomena of pin holes, micro clacks, and so forth, and is formed by means of one method selected from the group consisting of a wet oxidization method, a dry oxidization method, and an $O_3$ oxidization method.

As a result of the serial process described above, the first oxide film 3, the first nitride film 5, the second oxide film 7, the second nitride film 9, and the third oxide film 11, which have been formed on the substrate, form a dielectric layer A having an ONONO structure.

Thereafter, a metal film for gate electrodes or a polycrystalline silicon film 13 is deposited on the dielectric layer A having an ONONO structure.

Figure 2:
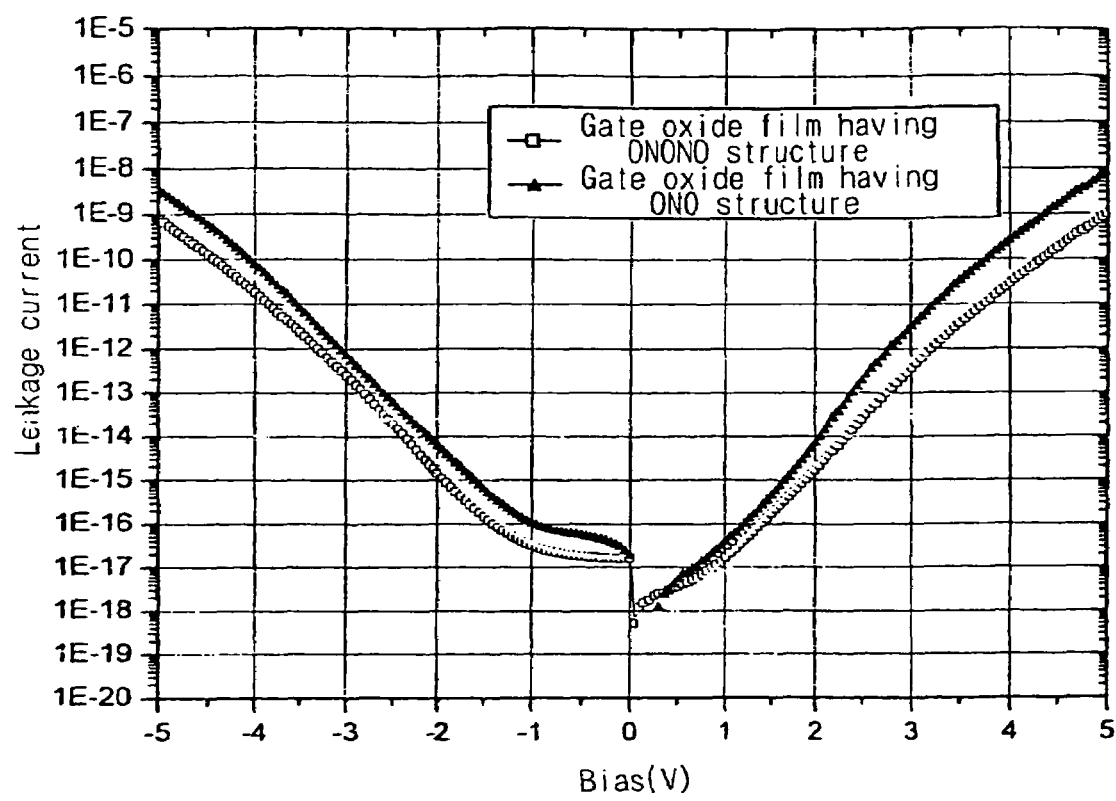
FIG. 2 is a graph illustrating respective I–V curves of an dielectric layer of an ONO structure having a single nitride film according to the prior art and an dielectric layer of an ONONO structure having multiple nitride films according to an embodiment of the present invention.

FIG. 2 is a graph illustrating respective I–V curves of an dielectric layer of an ONO structure having a single nitride film according to the prior art and an dielectric layer of an ONONO structure having multiple nitride films according to an embodiment of the present invention.

Referring to FIG. 2, it can be seen that the dielectric layer of the ONONO structure having multiple nitride films according to the present invention has an improved breakdown voltage without the decrease of capacitance, as compared to the conventional dielectric layer of the ONO structure having a single nitride film.

In the first embodiment of the present invention, a process of forming the dielectric layer of an ONONO structure is exampled in such a manner that an 'ONO' structure is formed in a first furnace, an 'N' structure (is formed) in a second furnace, and an 'O' structure (is formed) in a third furnace. However, the dielectric layer of an ONONO structure can be fabricated in such a manner that an 'NON' structure is formed in a first furnace and an 'O' structure (is formed) in a second furnace. In this case, a method of forming the 'NON' structure is performed in such a manner that first the same process as the second nitride treatment process is performed to form an 'N' structure of the first nitride film, oxygen is added to form an 'O' structure of an oxide film, and then a second nitride treatment process is again performed to form an 'N' structure of the last nitride film. It is recommended that the total thickness of the 'NON' structure is no more than 100 Å, preferably 30~60 Å.

FIGS. 3a to 3d are cross-sectional views, which are illustrated by the process, for explaining a method of fabricating a dielectric layer having an NONO structure according to a second embodiment of the present invention.

In a method of fabricating a dielectric layer of an NONO structure (a first nitride film, a first oxide film, a second nitride film, and a second oxide film) according to a second embodiment of the present invention, first, the surface of a substrate is washed using HF or BOE as wet-etching solution. Then, according to the same process as the first embodiment of the present invention, a first nitride film and a first oxide film are formed in sequence on the substrate, which has been washed, in a first furnace (not shown), a second nitride film is formed in a second furnace (not shown), and a second oxide film is formed in a third furnace (not shown).

Meanwhile, besides the method described above, it is possible that an 'NON' structure of a first nitride film, a first oxide film, and a second nitride film is formed in a first furnace, and then an 'O' structure of a second oxide film is formed in a second furnace. Hereinafter, such a formation method will be described in detail with reference to FIGS. 3a to 3d.

Figure 3A:
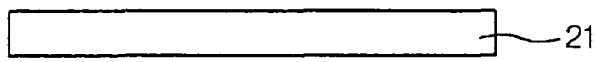
FIGS. 3a to 3d are cross-sectional views, which are illustrated by the process, for explaining a method of fabricating a dielectric layer having an NONO structure according to a second embodiment of the present invention.

First, as shown in FIG. 3a, the surface of a substrate 21 is washed using HF or BOE as a wet-etching solution (not shown). At this time, an oxide film and impurities remaining on the surface of the substrate is entirely removed by the washing treatment.

Figure 3B:
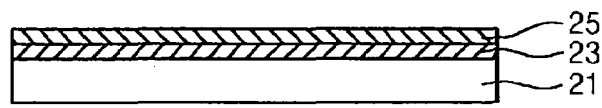

Next, as shown in FIG. 3b, the substrate 21 is loaded in a first furnace (not shown), and then a first nitride treatment process is performed to form a first nitride film 23. In this case, the first nitride treatment process is performed by means of a chemical vapor deposition method in such a manner that the first furnace is set to a temperature of 600~800° C. and a pressure of 0.05~2 Torr and a mixed gas from among $SiH_4+NH_3$ and $SiH_2Cl_2+NH_3$ is supplied in the second furnace, which is the same condition as that of the second nitride treatment process according to the first embodiment of the present invention.

Subsequently, the substrate having the first nitride film 23 is subjected to a first oxide treatment process, and thereby a first oxide film 25 is formed. In this case, the first oxide treatment process is performed in the first furnace in such a manner that the first furnace is set to a temperature of 600~800° C. and a pressure of 0.05~100 Torr and an oxygen or a mixed gas made by mixing oxygen and an inert gas, such as nitrogen, argon, and helium, is supplied in the first furnace. Meanwhile, it is recommended that the thickness of the first oxide film 25 is no more than 15 Å.

Figure 3C:
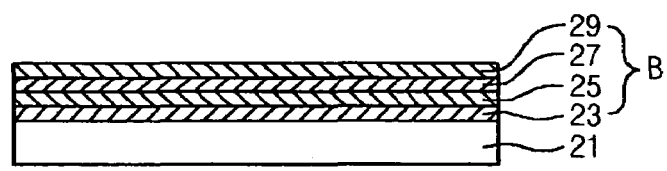
Figure 3D:
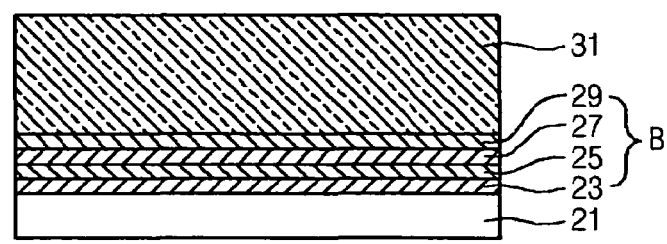

Thereafter, as shown in FIG. 3c, the substrate having the first oxide film 25 is subjected to a second nitride treatment process, and thereby a second nitride film 27 is formed. In this case, the second nitride treatment process is performed in the first furnace under the same condition of that of the first nitride treatment process.

Subsequently, the substrate on which the second nitride film 27 has been formed is loaded in a second furnace (not shown), and then the top surface of the second nitride film 27 is subjected to a second oxide treatment, and thereby a second oxide film 29 is formed. Meanwhile, the process of forming the second oxide film 29 may be performed in the first furnace.

The second oxide film 29 is a film for preventing phenomena of pin holes, micro clacks, and so forth, and is formed by means of one method selected from the group consisting of a wet oxidization method, a dry oxidization method, and an $O_3$ oxidization method. Also, it is recommended that the total thickness of the first nitride film 23, the first oxide film 25, and the second nitride film 27 is no more than 100 Å, preferably 30~60 Å.

As a result of the serial process described above, the first nitride film 23, the first oxide film 25, the second nitride film 27, and the second oxide film 29, which have been formed on the substrate 21, form a dielectric layer B having an NONO structure.

Thereafter, a metal film for gate electrodes or a polycrystalline silicon film 13 is deposited on the dielectric layer B having an NONO structure.

As described above, a dielectric layer according to the present invention has an ONONO structure or an NONO structure including multiple nitride films while having oxide films between the nitride films formed by a thin thickness. Therefore, a dielectric layer according to the present invention has a higher dielectric constant as compared to the conventional dielectric layer having a single nitride film, so that a breakdown voltage can be improved without the decrease of capacitance and the fabrication cost can be reduced because investment in new equipment is not required.

Also, with a dielectric layer structure according to the present invention, the last oxide film is formed by subjecting the top surface of a nitride film to an oxide treatment, and thereby pin holes and clacks are removed.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of fabricating a dielectric layer, the method comprising the steps of:
    providing a semiconductor substrate which has been washed;
    forming a first nitride film by loading the semiconductor substrate in a first furnace and subjecting the semiconductor substrate to a first nitride treatment;
    forming a first oxide film by unloading the semiconductor substrate having the first nitride film out of the first furnace and subjecting the semiconductor substrate to a first nitride treatment by introducing air while the semiconductor substrate is unloaded;
    forming a second nitride film by loading the semiconductor substrate having the first oxide film in a second furnace and subjecting the semiconductor substrate to a second nitride treatment; and
    forming a second oxide film by subjecting a top surface of the second nitride film to a second oxide treatment.

2. A method of fabricating a dielectric layer as claimed in claim 1, wherein the washing treatment process is performed by using one wet-etching solution of HF and BOE.

3. A method of fabricating a dielectric layer as claimed in claim 1, wherein the washing treatment process is performed by using a mixed liquid of $NH_4OH$, $H_2O_2$, and deionized water (DIW) or a $H_2SO_4$ solution as a wet-etching solution so as to form an initial oxide film on the surface of the semiconductor substrate.

4. A method of fabricating a dielectric layer as claimed in claim 1, wherein, in the first nitride treatment process, a heat treatment is performed for 3~180 minutes under a condition in which temperature and a pressure in the first furnace is set to 600~900° C. and 0.05~760 Torr, and $NH_3$ gas is supplied.

5. A method of fabricating a dielectric layer as claimed in claim 1, wherein, in the unloading process, a temperature of the last stage before unloading the semiconductor substrate out of the first furnace is maintained at 300~600° C.

6. A method of fabricating a dielectric layer as claimed in claim 1, wherein, in the unloading process, air including oxygen is supplied into the first furnace.

7. A method of fabricating a dielectric layer as claimed in claim 1, wherein the second nitride treatment process is performed by a chemical vapor deposition method using a mixed gas form among $SiH_4+NH_3$ and $SiH_2Cl_2+NH_3$ at a temperature of 600~800° C. and under a pressure of 0.05~2 Torr.

8. A method of fabricating a dielectric layer as claimed in claim 1, wherein the second oxide film formation process is performed by one method selected from the group consisting of a wet oxidization method.

9. A method of fabricating a dielectric layer as claimed in claim 1, wherein the second oxide film formation process is performed in a third furnace, not in the first and the second furnace.

10. A method of fabricating a dielectric layer, the method comprising the steps of:
   providing a semiconductor substrate which has been washed;
   forming a first nitride film by subjecting the semiconductor substrate to a first nitride treatment;
   forming a first oxide film by subjecting the semiconductor substrate having the first nitride film to a first nitride treatment;
   forming a second nitride film by subjecting the semiconductor substrate having the first oxide film to a second nitride treatment; and
   forming a second oxide film by subjecting a top surface of the second nitride film to a second oxide treatment.

11. A method of fabricating a dielectric layer as claimed in claim 10, wherein the washing treatment process is performed by using one wet-etching solution of HF and BOE.

12. A method of fabricating a dielectric layer as claimed in claim 10, wherein the washing treatment process is performed by using a mixed liquid of $NH_4OH$, $H_2O_2$, and deionized water (DIW) or a $H_2SO_4$ solution as a wet-etching solution so as to form an initial oxide film on the surface of the semiconductor substrate.

13. A method of fabricating a dielectric layer as claimed in claim 10, wherein each of the first and second nitride treatment processes is performed by a chemical vapor deposition method using a mixed gas from among $SiH_4+NH_3$ and $SiH_2Cl_2+NH_3$ at a temperature of 600~800° C. and under a pressure of 0.05~2 Torr.

14. A method of fabricating a dielectric layer as claimed in claim 10, wherein, in the first oxide treatment process, one of an oxygen gas and a mixture of an oxygen gas and an inert gas is supplied at a temperature of 600~800° C. and under a pressure of 0.05~100 Torr.

15. A method of fabricating a dielectric layer as claimed in claim 10, wherein the total thickness of the first nitride film, the first oxide film, and the second nitride film is 30~60 Å.

16. A method of fabricating a dielectric layer as claimed in claim 10, wherein the processes of forming the first nitride film, the first oxide film, and the second nitride film are performed in a first furnace, and the process of forming the second oxide film is performed in a second furnace, not in the first furnace.

17. A method of fabricating a dielectric layer as claimed in claim 10, wherein the processes of forming the first nitride film, the first oxide film, the second nitride film, and the second oxide film are performed in the same furnace.

* * * * *

UNITED STATES PATENT AND TRADEMARK OFFICE
CERTIFICATE OF CORRECTION

PATENT NO. : 6,964,930 B2  
APPLICATION NO. : 10/739620  
DATED : November 15, 2005  
INVENTOR(S) : Dong Su Park et al.

Page 1 of 1

It is certified that error appears in the above-identified patent and that said Letters Patent is hereby corrected as shown below:

In the Claims

Claim 1, column 6, line 54, replace "first nitride treatment" with --first oxide treatment--

Claim 10, column 7, line 37, replace "first nitride treatment" with --first oxide treatment--

Signed and Sealed this
Fifteenth Day of April, 2014

Michelle K. Lee
*Deputy Director of the United States Patent and Trademark Office*